US008734708B2

(12) United States Patent
Chen et al.

(10) Patent No.: US 8,734,708 B2

(45) Date of Patent: May 27, 2014

(54) POLAR POLYDIMETHYSILOXANE MOLDS, METHODS OF MAKING THE MOLDS, AND METHODS OF USING THE MOLDS FOR PATTERN TRANSFER

(75) Inventors: Wei Chen, Midland, MI (US); Brian Harkness, Midland, MI (US); Jae Woong Lim, ChungJu Si (KR); Michael Stanga, Greer, SC (US)

(73) Assignee: Dow Corning Corporation, Midland, MI (US)

( * ) Notice: Subject to any disclaimer, the term of this patent is extended or adjusted under 35 U.S.C. 154(b) by 519 days.

(21) Appl. No.: 12/669,834

(22) PCT Filed: Oct. 23, 2008

(86) PCT No.: PCT/US2008/080892

§ 371 (c)(1), (2), (4) Date: Jan. 20, 2010

(87) PCT Pub. No.: WO2009/021249

PCT Pub. Date: Feb. 12, 2009

(65) Prior Publication Data

US 2010/0206470 A1 Aug. 19, 2010

Related U.S. Application Data

(60) Provisional application No. 60/983,251, filed on Oct. 29, 2007.

(51) Int. Cl.
*B29C 35/08* (2006.01)

(52) U.S. Cl.
USPC ................................ 264/496; 528/12; 528/32

(58) Field of Classification Search
USPC ...................................... 264/496; 528/12, 32
See application file for complete search history.

(56) References Cited

U.S. PATENT DOCUMENTS 2,676,182 A 4/1954 Daudt et al.
3,159,601 A 12/1964 Ashby et al.
3,220,972 A 11/1965 Lamoreaux et al.
3,296,291 A 1/1967 Chalk et al.
3,419,593 A 12/1968 Willing et al.
3,445,420 A 5/1969 Kookootsedes et al.

(Continued)

FOREIGN PATENT DOCUMENTS

EP 0455137 A2 11/1991
EP 0347895 B1 11/1993
EP 1101167 B1 4/2006
WO WO 2006023037 A2 * 3/2006

OTHER PUBLICATIONS

Libioulle et al., "Contact-Inking Stamps for Microcontact Printing of Alkanethiols on Gold", Dec. 29, 1998, Langmuir 1999, 15, 300-304.*

(Continued)

*Primary Examiner* — Galen Hauth

(74) *Attorney, Agent, or Firm* — Claude F. Purchase; Erika Takeuchi; Catherine U. Brown

(57) ABSTRACT

A method includes the steps of (I) fabricating a cured silicone product and (II) using the cured silicone product in a patterning technique. The cured silicone product is a reaction product of (A) a silicone cure package and (B) is a polar additive having a polyalkylene oxide functionality and a reactive functionality. The method is useful in soft lithography applications.

13 Claims, 5 Drawing Sheets

Changes in the water contact angle and surface energy with increasing levels of additive in the mold (• contact angle, ◦ surface energy).

(56) References Cited

U.S. PATENT DOCUMENTS

| | | | |
|---|---|---|---|
| 3,516,946 | A | 6/1970 | Modic et al. |
| 3,814,730 | A | 6/1974 | Karstedt et al. |
| 3,989,667 | A | 11/1976 | Lee et al. |
| 3,989,668 | A | 11/1976 | Lee et al. |
| 4,370,358 | A | 1/1983 | Hayes et al. |
| 4,584,355 | A | 4/1986 | Blizzard et al. |
| 4,584,361 | A | 4/1986 | Janik et al. |
| 4,585,836 | A | 4/1986 | Homan et al. |
| 4,591,622 | A | 5/1986 | Blizzard et al. |
| 4,707,531 | A | 11/1987 | Shirahata |
| 4,766,176 | A | 8/1988 | Lee et al. |
| 4,784,879 | A | 11/1988 | Lee et al. |
| 4,962,086 | A | 10/1990 | Gallagher et al. |
| 5,017,654 | A | 5/1991 | Togashi et al. |
| 5,036,117 | A | 7/1991 | Chung et al. |
| 5,051,455 | A | 9/1991 | Chu et al. |
| 5,053,442 | A | 10/1991 | Chu et al. |
| 5,138,009 | A * | 8/1992 | Inoue .............................. 528/15 |
| 5,175,325 | A | 12/1992 | Brown et al. |
| 5,236,986 | A | 8/1993 | Sakuta et al. |
| 5,310,843 | A | 5/1994 | Morita et al. |
| 5,367,001 | A | 11/1994 | Itoh et al. |
| 5,889,108 | A | 3/1999 | Zhang |
| 6,169,142 | B1 | 1/2001 | Nakano et al. |
| 6,987,157 | B2 | 1/2006 | Clement et al. |
| 7,183,330 | B2 | 2/2007 | Furlan et al. |
| 2002/0098364 | A1 | 7/2002 | Bernard et al. |
| 2003/0006527 | A1 * | 1/2003 | Rabolt et al. .................. 264/220 |
| 2006/0254440 | A1 | 11/2006 | Choi et al. |
| 2007/0049716 | A1 | 3/2007 | Sayre |
| 2007/0298223 | A1 | 12/2007 | Loch et al. |

OTHER PUBLICATIONS

Martin, Brett D., et. al. “Fabrication and Application of Hydrogel Stampers for Physisorptive Microcontact Printing,” Langmuir, 2000, pp. 9944-9946, vol. 16, American Chemical Society.

Kim, Y.S., et. al. “Fabrication of Three-Dimensional Microstructures by Soft Molding,” Langmuir, 2004, pp. 2285-2287, vol. 79, No. 14, American Institute of Physics.

Trimbach, David C., et. al., “Hydrophilic Elastomers for Microcontact Printing of Polar Inks,” Langmuir, 2004, pp. 4738-4742, vol. 20, American Chemical Society.

Donzel, Christian, et. al., “Hydrophilic Poly(dimethylsiloxane) Stamps for Microcontact Printing,” Advanced Materials, 2001, vol. 13, No. 15.

Deng, Tao, et. al., “Micropatterning of Block Copolymer Solutions,” Langmuir, The ACS Journal of Surfaces and Colloids, Sep. 3, 2002, vol. 18, No. 18, American Chemical Society.

Schmid, H., et. al., “Siloxane Polymers for High-Resolution, High-Accuracy Soft Lithography,” Macromolecules, 2000, pp. 3042-3049, vol. 33, American Chemical Society.

Xia, Younan, et. al., “Soft Lithography,” Angew. Chem. Int. Ed., 1998, pp. 550-575, vol. 37.

Favre, E., “Swelling of Crosslinked Polydimethylsiloxane Networks by Pure Solvents: Influence of Temperature,” Eur. Polym. J., 1996, pp. 1183-1188, vol. 43, No. 10, Great Britain.

Kim, Y.S., et. al., “Three-Dimensional Pattern Transfer and Nanolithography: Modified Soft Molding,” Applied Physics Letters, Aug. 5, 2002, pp. 1011-1013, vol. 81, No. 6, American Institute of Physics.

* cited by examiner

Figure 1. 5 μm features replicated into the surface of an EO-PO modified PDMS mold. In this example, 5 % EO-PO was added into the SYLGARD® 184 formulation.

Figure 2. Changes in the water contact angle and surface energy with increasing levels of additive in the mold (• contact angle, ◦ surface energy).

Figure 3. Permeability of ethanol through a modified SYLGARD® 184 mold membrane as a function of the amount of additive.

Figure 4. Ethanol saturation weight gain as a function of the amount of additive in SYLGARD® 184 molds.

POLAR POLYDIMETHYSILOXANE MOLDS, METHODS OF MAKING THE MOLDS, AND METHODS OF USING THE MOLDS FOR PATTERN TRANSFER

CROSS REFERENCE TO RELATED APPLICATIONS

This application is a U.S. national stage filing under 35 U.S.C. §371 of PCT application Ser. No. PCT/US08/080892 filed on 23 Oct. 2008, currently pending, which claims the benefit of U.S. Provisional Patent Application No. 60/983251 filed 29 Oct. 2007 under 35 U.S.C. §119 (e). PCT application Ser. No. PCT/US08/080892 and U.S. Provisional Patent Application No. 60/983251 are hereby incorporated by reference.

STATEMENT REGARDING FEDERALLY SPONSORED RESEARCH

None.

BACKGROUND OF THE INVENTION

Polydimethylsiloxane (PDMS) molds have been widely used in soft lithography, specifically for making stamps for micro-contact printing (μCP) and soft micro-molding processes. DOW CORNING® SYLGARD® 184 is the most common mold making material for these applications. PDMS offers several desirable properties, such as elasticity, conformal contact, low surface energy, good surface release, and transparency. In a pattern transfer technique, such as roll printing or μCP process, the use of polar inks can create issues of incompatibility between the ink and the hydrophobic PDMS mold surface. In micro-molding processes, solvent based polymers are used as printing media, and PDMS based molds have only limited permeability to the more polar solvents.

For applications that require patterning of polar solvent-based polymer films followed by solvent removal in the mold, the solvent diffusion rate of PDMS may not be sufficiently practical. This is largely attributed to the non-polar nature of PDMS. A typical method to increase the polarity of a PDMS mold is to treat the surface with an oxygen based plasma. However it is known in art that the induced surface hydrophilicity is not permanent and will disappear in a few hours. A number of organic hydrophilic elastomer molds have been reported to work with polar inks for μCP. The use of organic molds has not been as widely accepted as PDMS molds. Pattern transfer has been successfully demonstrated on solvent based polymer films using modified PDMS molds. Solvent removal from under the mold is a critical factor in the patterning step. It is desirable to have a high solvent diffusion rate or high solvent adsorption in the mold to enhance solvent removal for successful pattern transfer.

BRIEF SUMMARY OF THE INVENTION

A method comprises fabricating a cured silicone product by a process comprising curing a curable silicone composition comprising:

(A) a polar additive comprising a polyalkylene oxide functionality and a reactive functionality, and (B) a silicone cure package. The cured silicone product may be used in a pattern transfer technique.

DETAILED DESCRIPTION OF THE INVENTION

Figure 1:
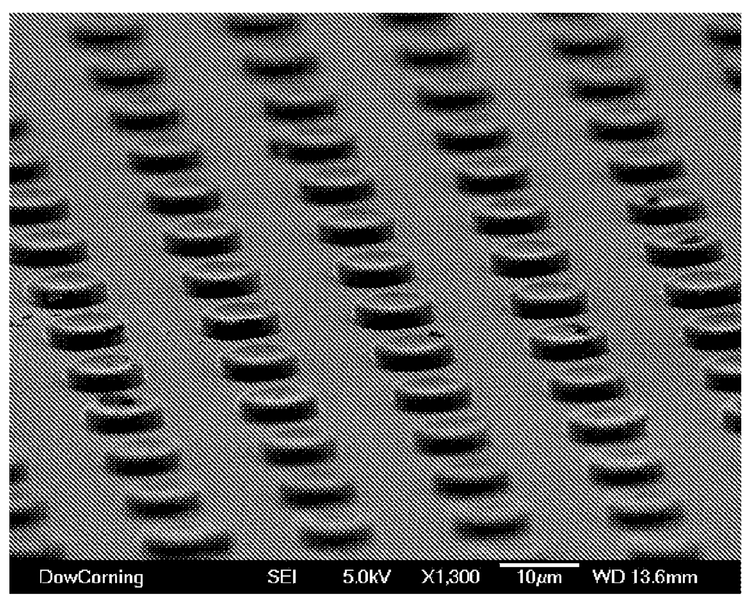
FIG. 1 shows 5 micrometer size features replicated into the surface of an EO-PO modified PDMS mold as prepared in example 1, described below. In this example, 5% EO-PO was added into a SYLGARD® 184 formulation.

A chemical route is disclosed to make cured silicone products in which a polar additive is directly cross-linked. The cured silicone products are useful, for example, in patterning techniques such as pattern transfer and pattern formation. The cured silicone products may be used as silicone molds for soft lithography applications. The cured silicone products may exhibit high surface energy and high diffusion rate for polar solvents. The cured silicone products may have higher surface polarity than products that do not contain a polar additive, without the problems of non-chemically bound additive molecules degrading the mechanical and surface properties during multiple print processes.

Curable Silicone Composition

The curable silicone composition useful in the method described above comprises ingredient (A), a polar additive comprising a polyalkylene oxide functionality and a reactive functionality, where the reactive functionality is reactive with at least one ingredient of ingredient (B), a silicone cure package. The silicone cure package may be selected from the group consisting of a condensation reaction curable composition, a hydrosilylation curable composition, a radical curable composition, a ring opening polymerizable composition (e.g., an epoxy curable composition), an addition curable composition (such as an isocyanate curable composition or a hydrosilylation curable composition), or a combination thereof.

Polar Additive

The polar additive comprises a poly(alkylene oxide) functionality. The polar additive is reactive with at least one ingredient of a silicone cure package, therefore, the polar additive further comprises a reactive group. The reactive group may be terminal or pendant. Alternatively, the reactive group may be terminal; for example, the polar additive may have one terminal reactive group or more than one terminal reactive group. The selection of the reactive group depends on the selection of the silicone cure package. For example, when a hydrosilylation curable composition is used as the silicone cure package, the reactive group may be an aliphatically unsaturated organic group, a silicon bonded hydrogen atom, or a combination thereof. Alternatively, the reactive group may be an alkenyl group such as vinyl or an alkynyl group. When a condensation reaction curable composition is used, then the reactive group may be, for example, halogen atoms, acetamido groups, acyloxy groups such as acetoxy, alkoxy groups, amido groups, amino groups, aminoxy groups, hydroxyl groups, oximo groups, ketoximo groups, methylacetamido groups, alkoxysilylhydrocarbylene groups, or a combination thereof; alternatively a hydroxyl group or an alkoxy group or a combination thereof. Alternatively, when an epoxy curable composition is used, then the reactive group may be an epoxy functional organic group or a hydroxyl group or a combination thereof.

The amount of polar additive depends on various factors including the type of polar additive selected and the silicone cure package selected, however, the amount of polar additive may range from 0.5% to 20% based on the weight of the curable silicone composition. Without wishing to be bound by theory, it is thought that if less than 0.5% is used, then the cured silicone product prepared by curing the curable silicone composition will lack sufficient hydrophilic character for some pattern formation techniques, but if the amount of polar additive is greater than 20%, then this may cause viscosity of the curable silicone composition to increase to an undesirable level or the surface of the cured silicone product to become bumpy rather than smooth, or both.

The polar additive may comprise a polyalkylene oxide-functional siloxane such as a propylene oxide-functional siloxane. Examples of suitable propylene oxide-functional siloxanes include dimethyl, methyl(propylglycidoxy), methyl(propyl(poly(PO))methyl)cyclosiloxanes; dimethyl, methyl(glycidoxypropyl), methyl(propyl(poly(PO))methyl) siloxane; and combinations thereof. For purposes of this application, "EO" represents ethylene oxide, and "PO" represents propylene oxide. Alternatively, the polar additive may comprise a poly(ethylene oxide/propylene oxide) polymer, such as an ethylene-oxide-propylene oxide molecular chain with a vinyl-functional terminal group, a hydroxyl functional terminal group, or a combination thereof.

The polar additive may have the empirical formula:

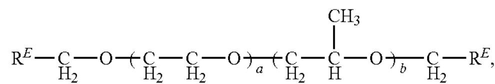

where each $R^E$ is independently a reactive endgroup exemplified by the reactive groups described above; subscript a has a value ranging from 1 to 20, alternatively 7.8 to 18; and subscript b has a value ranging from 0 to 20, alternatively 4 to 18.

Exemplary polar additives include polyglycols AE400 and AE501, which are available from The Dow Chemical Company of Midland, Mich., USA. These are allyl functional poly(alkylene oxide) polymers of the formula:

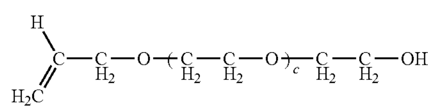

where subscript c has an average value of 7.8 or 11.2, respectively.

Another polar additive is a monoallyloxy terminated poly (ethylene oxide/propylene oxide) polymer. This polar additive may be used, for example, with a hydrosilylation curable composition, a condensation reaction curable composition, or a dual cure (hydrosilylation and condensation) reaction curable composition. An example of one such polar additive, XUS-13461, which is commercially available from The Dow Chemical Company of Midland, Mich., USA, has the formula:

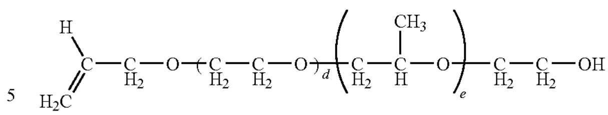

where subscript d=10 and subscript e=4. Another polar additive, also available from Dow Chemical, is XF 13507, which as the same formula except that d is 18 and e is 18.

Pluronic® polymers, such as P103, P104, and P105, are commercially available from BASF Corporation of Florham Park, N.J., USA. These are hydroxyl terminated poly(oxyethylene-oxypropylene) copolymers having average molecular weights varying from 3900 to 6500. These polar additives may be used, for example, with a condensation reaction curable composition.

Silicone Cure Package

The curable silicone composition of this invention cures to form a cured silicone product. The curing mechanism of the silicone cure package in the curable silicone composition may be moisture curable such as a one part or two part room temperature vulcanizing (RTV) composition, hydrosilylation curable such as a thermally curable one part composition or a two part composition that cures at ambient or elevated temperature, a ring opening cure system (e.g, an epoxy curable composition), a radical curable composition (such as a UV cure system that generates a radical by a radiative mechanism or an alkyl borane cure system that generates a radical by a non-radiative mechanism), an addition cure system (e.g., isocyanate addition curable composition or hydrosilylation curable composition), or a combination thereof. Typically, each silicone cure package comprises at least two of a base polymer, a crosslinking agent, and a catalyst.

Moisture Cure Packages

The moisture cure package may comprise: 100 parts by weight of (I) a base polymer, an amount sufficient to cure the composition of (II) a crosslinking agent, and optionally an amount sufficient to accelerate curing of the composition of (III) a catalyst.

Ingredient (I) Base Polymer

Ingredient (I) in the moisture cure package is a polyorganosiloxane having an average per molecule of at least two hydrolyzable substituents, such as halogen atoms, acetamido groups, acyloxy groups such as acetoxy, alkoxy groups, amido groups, amino groups, aminoxy groups, hydroxyl groups, oximo groups, ketoximo groups, methylacetamido groups, alkoxysilylhydrocarbylene groups, or a combination thereof. The hydrolyzable substituents in ingredient (I) may be located at terminal, pendant, or both terminal and pendant positions. Ingredient (I) may have a linear or branched structure. Ingredient (I) may be a homopolymer or a copolymer.

Ingredient (I) may comprise an alkoxy-endblocked polydiorganosiloxane, an alkoxysilylhydrocarbylene-endblocked polydiorganosiloxane, a hydroxyl-endblocked polydiorganosiloxane, or a combination thereof.

Ingredient (I) may comprise a polydiorganosiloxane of Formula (i):

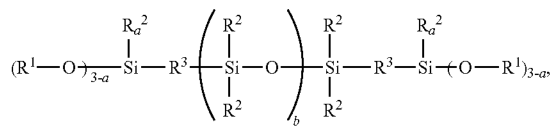

where each $R^1$ is independently a hydrolyzable substituent, each $R^2$ is independently a monovalent organic group, each $R^3$ is independently an oxygen atom or a divalent hydrocarbon group, each subscript a is independently 0, 1, or 2, and subscript b is an integer having a value sufficient to provide the polydiorganosiloxane with a viscosity of at least 100 mPa·s at 25° C.

Suitable hydrolyzable substituents for $R^1$ include, but are not limited to, a halogen atom, an acetamido group, an acetoxy group, an acyloxy group, an alkoxy group, an amido group, an amino group, an aminoxy group, a hydroxyl group, an oximo group, a ketoximo group, and a methylacetamido group.

Suitable organic groups for $R^2$ include, but are not limited to, monovalent substituted and unsubstituted hydrocarbon groups. Examples of monovalent unsubstituted hydrocarbon groups for $R^2$ include, but are not limited to, alkyl such as methyl, ethyl, propyl, pentyl, octyl, undecyl, and octadecyl; cycloalkyl such as cyclohexyl; aryl such as phenyl, tolyl, xylyl, benzyl, and 2-phenylethyl. Examples of monovalent substituted hydrocarbon groups for $R^2$ include, but are not limited to, monovalent halogenated hydrocarbon groups such as chlorinated alkyl groups such as chloromethyl and chloropropyl groups; fluorinated alkyl groups such as fluoromethyl, 2-fluoropropyl, 3,3,3-trifluoropropyl, 4,4,4-trifluorobutyl, 4,4,4,3,3-pentafluorobutyl, 5,5,5,4,4,3,3-heptafluoropentyl, 6,6,6,5,5,4,4,3,3-nonafluorohexyl, and 8,8,8,7,7-pentafluorooctyl; chlorinated cycloalkyl groups such as 2,2-dichlorocyclopropyl, 2,3-dichlorocyclopentyl; and fluorinated cycloalkyl groups such as 2,2-difluorocyclopropyl, 2,3-difluorocyclobutyl, 3,4-difluorocyclohexyl, and 3,4-difluoro-5-methylcycloheptyl. Examples of monovalent substituted hydrocarbon groups for $R^2$ include, but are not limited to, hydrocarbon groups substituted with oxygen atoms such as glycidoxyalkyl, and hydrocarbon groups substituted with nitrogen atoms such as aminoalkyl and cyano-functional groups such as cyanoethyl and cyanopropyl. Alternatively, each $R^2$ may be an alkyl group.

Ingredient (I) may comprise an $\alpha,\Omega$-difunctional-polydiorganosiloxane when, in Formula (i) above, each a is 2 and each $R^3$ is an oxygen atom. For example, ingredient (I) may have Formula (ii): $R^1R^2_2SiO—(R^2_2SiO)_b—SiR^2_2R^1$, where $R^1$ and $R^2$ are as described above and b is an integer having a value ranging from 50 to 1,000, alternatively 200 to 700.

Ingredient (I) may comprise a hydroxyl-functional polydiorganosiloxane of the formula described above, in which each $R^1$ may be a hydroxyl group, each $R^2$ may be an alkyl group such as methyl, and b may have a value such that the hydroxyl functional polydiorganosiloxane has a viscosity of at least 100 mPa·s at 25° C. Alternatively, b may have a value ranging from 50 to 700. Exemplary hydroxyl-endblocked polydiorganosiloxanes are hydroxyl-endblocked polydimethylsiloxanes. Hydroxyl-endblocked polydiorganosiloxanes suitable for use as ingredient (I) may be prepared by methods known in the art, such as hydrolysis and condensation of the corresponding organohalosilanes or equilibration of cyclic polydiorganosiloxanes.

Ingredient (I) may further comprise polydimethylsiloxanes endblocked on one terminal end by a triorganosilyl group, e.g., $(CH_3)_3Si—$, and on the other end by a hydroxyl group. The polydiorganosiloxanes having both hydroxyl end groups and triorganosilyl end groups, may have more than 50%, alternatively more than 75%, of the total end groups as hydroxyl groups. The amount of triorganosilyl group in the polymer may be used to regulate the modulus of the resulting cured silicone product. Without wishing to be bound by theory, it is thought that higher concentrations of triorganosilyl end groups provide a lower modulus in cured silicone product.

Alternatively, ingredient (I) may comprise an alkoxysilylhydrocarbylene-endblocked polydiorganosiloxane, for example when in Formula (i) above each $R^3$ is divalent hydrocarbon group or a combination of a divalent hydrocarbon group and a divalent siloxane group. $R^3$ may be an alkylene group such as ethylene, propylene, or hexylene; an arylene group such as phenylene, or an alkylarylene group such as:

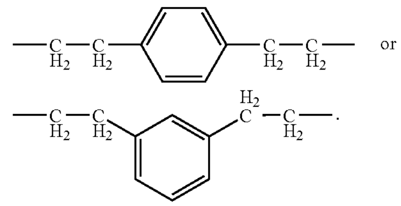

Alternatively, each $R^1$ and each $R^2$ may be alkyl, each $R^3$ may be ethylene, and a may be 0.

Ingredient (I) can be a single base polymer or a combination comprising two or more base polymers that differ in at least one of the following properties: average molecular weight, siloxane units, sequence, and viscosity.

Alkoxysilylhydrocarbylene-endblocked polydiorganosiloxanes may be prepared by reacting a vinyl-terminated, polydimethylsiloxane with (alkoxysilylhydrocarbyl)tetramethyldisiloxane. Alkoxysilylhydrocarbylene-endblocked polydiorganosiloxanes are known in the art and are disclosed in U.S. Pat. Nos. 4,962,076; 5,051,455; and 5,053,442.

Ingredient (I) may further comprise an MQ resin, which comprises siloxane units of the formulae $R^1_zR^2_{3-z}SiO_{1/2}$ and $SiO_{4/2}$, where $R^1$ and $R^2$ are as described above and each instance of subscript z is 0, 1, or 2. The MQ resin may have a ratio of M units to Q units (M:Q) of 0.5 to 1.2. Methods of preparing MQ resins are known in the art. For example, a MQ resin may be prepared by treating a product produced by the silica hydrosol capping process of Daudt, et al. disclosed in U.S. Pat. No. 2,676,182. Briefly stated, the method of Daudt, et al. involves reacting a silica hydrosol under acidic conditions with a hydrolyzable triorganosilane such as trimethylchlorosilane, a siloxane such as hexamethyldisiloxane, or a combination thereof, and recovering a product comprising M and Q units (MQ resin). The resulting MQ resins may contain from 2 to 5 percent by weight of silicon-bonded hydroxyl groups.

Ingredient (II) Crosslinker

Ingredient (II) in the moisture cure package is a crosslinker added to the curable silicone composition in an amount sufficient to cure the curable silicone composition without too much weight loss from condensation products of the curing reaction and insufficient to allow curing of the curable silicone composition during storage for several months in a moisture impermeable package. The exact amount of ingredient (II) depends on various factors including the hydrolyzable substituents of ingredients (I) and (II); however, the amount of ingredient (II) may range from 0.5 to 15 parts based on 100 parts by weight of ingredient (I). Ingredient (II) may comprise a silane crosslinker having hydrolyzable groups or partial or full hydrolysis products thereof. Examples of suitable silane crosslinkers may have the general formula (iii) $R^4_cSi(R^5)_{4-c}$, where each $R^4$ is independently a monovalent hydrocarbon group such as an alkyl group; each $R^5$ is a hydrolyzable substituent, for example a halogen atom, an acetamido group, an acyloxy group such as acetoxy, an alkoxy group, an amido group, an amino group, an aminoxy group, a hydroxyl group, an oximo group, a ketoximo group, or a methylacetamido group; and subscript c is 0, 1, 2, or 3. Alternatively, each $R^5$ may be independently selected from hydroxyl, alkoxy, acetoxy, amide, or oxime. Alternatively, ingredient (II) may be selected from an acyloxysilane, an alkoxysilane, a ketoximosilane, and an oximosilane.

Ingredient (II) may comprise an alkoxysilane exemplified by a dialkoxysilane, such as a dialkyldialkoxysilane; a trialkoxysilane, such as an alkyltrialkoxysilane; a tetraalkoxysilane; or partial or full hydrolysis products thereof, or another combination thereof. Examples of suitable trialkoxysilanes include methyltrimethoxysilane, methyltriethoxysilane, ethyltrimethoxysilane, ethyltriethoxysilane, and a combination thereof, and alternatively methyltrimethoxysilane. Examples of suitable tetraalkoxysilanes include tetraethoxysilane. The amount of the alkoxysilane that is used in the curable silicone composition may range from 0.5 to 15 parts by weight per 100 parts by weight of ingredient (A). Examples of alkoxysilane crosslinkers are disclosed in U.S. Pat. Nos. 4,962,076; 5,051,455; and 5,053,442.

Ingredient (II) may comprise an acyloxysilane, such as an acetoxysilane. Acetoxysilanes include a tetraacetoxysilane, an organotriacetoxysilane, a diorganodiacetoxysilane, or a combination thereof. The acetoxysilane may contain alkyl groups such as methyl, ethyl, propyl, isopropyl, butyl, and tertiary butyl; alkenyl groups such as vinyl, allyl, or hexenyl; aryl groups such as phenyl, tolyl, or xylyl; aralkyl groups such as benzyl or 2-phenylethyl; and fluorinated alkyl groups such as 3,3,3-trifluoropropyl. Alternatively, ingredient (II) may comprise organotriacetoxysilanes, for example mixtures containing methyltriacetoxysilane and ethyltriacetoxysilane. The amount of the acetoxysilane that is used in the curable silicone composition may range from 0.5 to 15 parts by weight per 100 parts by weight of ingredient (I); alternatively 3 to 10 parts by weight of acetoxysilane per 100 parts by weight of ingredient (I).

Ingredient (III) Catalyst

Ingredient (III) is a catalyst that may optionally be added to the moisture cure package to accelerate curing. Ingredient (III) in the moisture cure package may comprise a carboxylic acid salt of metal, a tin compound, a titanium compound, or a zirconium compound.

Ingredient (III) may comprise carboxylic acid salts of metals, ranging from lead to manganese inclusive, in the electromotive series of metals. Alternatively, ingredient (III) may comprise a chelated titanium compound, a titanate such as a tetraalkoxytitanate, or a combination thereof. Examples of suitable titanium compounds include, but are not limited to, diisopropoxytitanium bis(ethylacetoacetate), tetrabutoxy titanate, tetrabutyltitanate, tetraisopropyltitanate, and bis-(ethoxyacetoacetonate)diisopropoxy titanium (IV), and a combination thereof. Alternatively ingredient (III) may comprise a tin compound such as dibutyltin diacetate, dibutyltin dilaurate, dibutyl tin oxide, stannous octoate tin oxide, or a combination thereof. Examples of catalysts are disclosed in U.S. Pat. Nos. 4,962,076; 5,051,455; and 5,053,442.

These moisture cure packages are stable when the curable silicone compositions containing them are stored in containers that protect them from exposure to moisture, but the compositions cure rapidly when exposed to moisture.

Hydrosilylation Cure Packages

The curable silicone composition may comprise a hydrosilylation cure package in addition to, or instead of, the moisture cure package. The hydrosilylation cure package may comprise: 50% to 95%, based on the weight of the composition, of (I') a base polymer, 5% to 50%, based on the weight of the composition, of (II') a crosslinking agent, and an amount sufficient to initiate curing of the composition of (III') a catalyst.

Ingredient (I') Base Polymer

Ingredient (I') of the hydrosilylation cure package may comprise a polyorganosiloxane having an average of at least two aliphatically unsaturated organic groups per molecule. Ingredient (I') may have a linear, branched, or resinous structure; or a combination thereof. Alternatively, ingredient (I') may be linear. Ingredient (A') may be a homopolymer or a copolymer, or a combination thereof. The aliphatically unsaturated organic groups may be alkenyl groups, alkynyl groups, (meth)acrylate-functional groups, or combinations thereof. The alkenyl groups may have 2 to 12 carbon atoms and are exemplified by, but not limited to, vinyl, allyl, butenyl, and hexenyl. The alkynyl groups may have 2 to 12 carbon atoms, and are exemplified by, but not limited to, ethynyl, propynyl, and butynyl. The (meth)acrylate-functional groups are exemplified by, but not limited to, acryloyloxyalkyl such as acryloyloxypropyl and methacryloyloxyalkyl such as methacryloyloxypropyl. The aliphatically unsaturated organic groups in ingredient (I') may be located at terminal, pendant, or both terminal and pendant positions.

The remaining silicon-bonded organic groups in ingredient (I') may be monovalent organic groups free of aliphatic unsaturation. These monovalent organic groups may have 1 to 20 carbon atoms, alternatively 1 to 10 carbon atoms, and are exemplified by, but not limited to alkyl groups such as methyl, ethyl, propyl, pentyl, octyl, undecyl, and octadecyl; cycloalkyl groups such as cyclohexyl; and aromatic groups such as phenyl, tolyl, xylyl, benzyl, and 2-phenylethyl; and cyano-functional groups such as cyanoalkyl groups exemplified by cyanoethyl and cyanopropyl.

Ingredient (I') may comprise a polyorganosiloxane of $$R^6_2R^7SiO(R^6_2SiO)_d(R^6R^7SiO)_eSiR^6_2R^7, \quad \text{Formula (iv):}$$

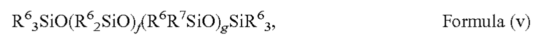

$$R^6_3SiO(R^6_2SiO)_f(R^6R^7SiO)_gSiR^6_3, \quad \text{Formula (v)}$$

or a combination thereof.

In Formulae (iv) and (v), each $R^6$ is independently a monovalent organic group free of aliphatic unsaturation and each $R^7$ is independently an aliphatically unsaturated organic group, subscript d has an average value ranging from 0 to 2000, subscript e has an average value ranging from 0 to 2000, subscript f has an average value ranging from 0 to 2000, and subscript g has an average value ranging from 2 to 2000. Suitable monovalent organic groups for $R^6$ include, but are not limited to, alkyl such as methyl, ethyl, propyl, pentyl, octyl, undecyl, and octadecyl; cycloalkyl such as cyclohexyl; and aryl such as phenyl, tolyl, xylyl, benzyl, and 2-phenylethyl. Each $R^7$ is independently an aliphatically unsaturated monovalent organic group. $R^7$ is exemplified by alkenyl groups such as vinyl, allyl, and butenyl; alkynyl groups such as ethynyl and propynyl; and (meth)acrylate-functional groups such as acryloyloxypropyl and methacryloyloxypropyl.

Ingredient (I') may comprise polydiorganosiloxanes such as i) dimethylvinylsiloxy-terminated polydimethylsiloxane,
ii) dimethylvinylsiloxy-terminated poly(dimethylsiloxane/methylvinylsiloxane),
iii) dimethylvinylsiloxy-terminated polymethylvinylsiloxane,
iv) trimethylsiloxy-terminated poly(dimethylsiloxane/methylvinylsiloxane),
v) trimethylsiloxy-terminated polymethylvinylsiloxane,
vi) dimethylvinylsiloxy-terminated poly(dimethylsiloxane/methylphenylsiloxane),
vii) dimethylvinylsiloxy-terminated poly(dimethylsiloxane/diphenylsiloxane),
viii) phenyl,methyl,vinyl-siloxy-terminated polydimethylsiloxane,
ix) dimethyl-acryloyloxypropyl-siloxy-terminated polydimethylsiloxane,
x) dimethyl-methacryloyloxypropyl-siloxy-terminated polydimethylsiloxane,
xi) dimethylhexenylsiloxy-terminated polydimethylsiloxane,
xii) dimethylhexenylsiloxy-terminated poly(dimethylsiloxane/methylhexenylsiloxane),
xiii) dimethylhexenylsiloxy-terminated polymethylhexenylsiloxane,
xiv) trimethylsiloxy-terminated poly(dimethylsiloxane/methylhexenylsiloxane),
xv) dimethylvinylsiloxy-terminated poly(dimethylsiloxane/methylcyanopropylsiloxane), and
xvi) a combination thereof.

Methods of preparing polydiorganosiloxanes suitable for use as ingredient (I'), such as hydrolysis and condensation of the corresponding organohalosilanes or equilibration of cyclic polydiorganosiloxanes, are well known in the art.

Ingredient (I') may further comprise a resin such as an MQ resin consisting essentially of $R^8_3SiO_{1/2}$ units and $SiO_{4/2}$ units, a TD resin consisting essentially of $R^8SiO_{3/2}$ units and $R^8_2SiO_{2/2}$ units, an MT resin consisting essentially of $R^8_3SiO_{1/2}$ units and $R^8SiO_{3/2}$ units, an MTD resin consisting essentially of $R^8_3SiO_{1/2}$ units, $R^8SiO_{3/2}$ units, and $R^8_2SiO_{2/2}$ units, or a combination thereof.

Each $R^8$ is a monovalent organic group. The monovalent organic groups represented by $R^8$ may have 1 to 20 carbon atoms, alternatively 1 to 10 carbon atoms. Examples of monovalent organic groups include, but are not limited to, monovalent hydrocarbon groups and monovalent substituted hydrocarbon groups. Examples of monovalent organic groups include, but are not limited to, (meth)acrylate-functional groups such as acryloxyalkyl groups or methacryloxyalkyl groups, cyano-functional groups, and monovalent hydrocarbon groups. Monovalent hydrocarbon groups include, but are not limited to, alkyl such as methyl, ethyl, propyl, pentyl, octyl, undecyl, and octadecyl; cycloalkyl such as cyclohexyl; alkenyl such as vinyl, allyl, butenyl, and hexenyl; alkynyl such as ethynyl, propynyl, and butynyl; and aryl such as phenyl, tolyl, xylyl, benzyl, and 2-phenylethyl. Cyano-functional groups include, but are not limited to cyanoalkyl groups such as cyanoethyl and cyanopropyl.

The resin may contain an average of 3 to 30 mole percent of aliphatically unsaturated organic groups. The aliphatically unsaturated organic groups may be alkenyl groups, alkynyl groups, (meth)acrylate-functional groups, or a combination thereof. The mole percent of aliphatically unsaturated organic groups in the resin is the ratio of the number of moles of unsaturated group-containing siloxane units in the resin to the total number of moles of siloxane units in the resin, multiplied by 100.

Methods of preparing resins are well known in the art. For example, resin may be prepared by treating a resin copolymer produced by the silica hydrosol capping process of Daudt, et al. with at least an alkenyl-containing endblocking reagent. The method of Daudt et al., is disclosed in U.S. Pat. No. 2,676,182.

Briefly stated, the method of Daudt, et al. involves reacting a silica hydrosol under acidic conditions with a hydrolyzable triorganosilane such as trimethylchlorosilane, a siloxane such as hexamethyldisiloxane, or mixtures thereof, and recovering a copolymer having M and Q units. The resulting copolymers generally contain from 2 to 5 percent by weight of hydroxyl groups.

The resin, which typically contains less than 2 percent by weight of silicon-bonded hydroxyl groups, may be prepared by reacting the product of Daudt, et al. with an unsaturated organic group-containing endblocking agent and an endblocking agent free of aliphatic unsaturation, in an amount sufficient to provide from 3 to 30 mole percent of unsaturated organic groups in the final product. Examples of endblocking agents include, but are not limited to, silazanes, siloxanes, and silanes. Suitable endblocking agents are known in the art and exemplified in U.S. Pat. Nos. 4,584,355; 4,591,622; and 4,585,836. A single endblocking agent or a mixture of such agents may be used to prepare the resin.

Ingredient (I') can be a single base polymer or a combination comprising two or more base polymers that differ in at least one of the following properties: structure, viscosity, average molecular weight, siloxane units, and sequence.

Ingredient (II') Organohydrogenpolysiloxane

Ingredient (II') in the hydrosilylation cure package is an organohydrogenpolysiloxane having an average of at least two silicon-bonded hydrogen atoms per molecule. Ingredient (II') can be a homopolymer or a copolymer, or a combination thereof. Ingredient (II') can have a linear, branched, cyclic, or resinous structure, or a combination thereof. The silicon-bonded hydrogen atoms in ingredient (II') can be located at terminal, pendant, or at both terminal and pendant positions.

Ingredient (II') may comprise siloxane units including, but not limited to, $HR^9_2SiO_{1/2}$, $R^9_3SiO_{1/2}$, $HR^9SiO_{2/2}$, $R^9_2SiO_{2/2}$, $R^9SiO_{3/2}$, and $SiO_{4/2}$ units. In the preceding formulae, each $R^9$ is independently selected from monovalent organic groups.

Ingredient (II') may comprise a compound of the formula $$R^9_3SiO(R^9_2SiO)_h(R^9HSiO)_iSiR^9_3, \quad (VI)$$

$$R^9_2HSiO(R^9_2SiO)_j(R^9HSiO)_kSiR^9_2H, \text{ or} \quad (VII)$$

(VIII) a combination thereof.

In formulae above, subscript h has an average value ranging from 0 to 2000, subscript i has an average value ranging from 2 to 2000, subscript j has an average value ranging from 0 to 2000, and subscript k has an average value ranging from 0 to 2000. Each $R^9$ is independently a monovalent organic group. Suitable monovalent organic groups include alkyl such as methyl, ethyl, propyl, pentyl, octyl, undecyl, and octadecyl; cycloalkyl such as cyclohexyl; alkenyl such as vinyl, allyl, butenyl, and hexenyl; alkynyl such as ethynyl, propynyl, and butynyl; and aryl such as phenyl, tolyl, xylyl, benzyl, and 2-phenylethyl. Alternatively, each $R^9$ is independently a monovalent organic group free of aliphatic unsaturation. Suitable monovalent organic groups free of aliphatic unsaturation include alkyl groups such as methyl, ethyl, propyl, and butyl; aromatic groups such as phenyl, tolyl, and xylyl; and cyano-functional groups exemplified by cyanoalkyl groups such as cyanoethyl and cyanopropyl.

Ingredient (II') is exemplified by a) dimethylhydrogensiloxy-terminated polydimethylsiloxane,
b) dimethylhydrogensiloxy-terminated poly(dimethylsiloxane/methylhydrogensiloxane),
c) dimethylhydrogensiloxy-terminated polymethylhydrogensiloxane,
d) trimethylsiloxy-terminated poly(dimethylsiloxane/methylhydrogensiloxane),
e) trimethylsiloxy-terminated polymethylhydrogensiloxane,
f) a resin consisting essentially of $H(CH_3)_2SiO_{1/2}$ units and $SiO_{4/2}$ units, and
g) a combination thereof.

Ingredient (II') may be a combination of two or more organohydrogenpolysiloxanes that differ in at least one of the following properties: structure, average molecular weight, viscosity, siloxane units, and sequence.

Methods of preparing linear, branched, and cyclic organohydrogenpolysiloxanes suitable for use as ingredient (II'), such as hydrolysis and condensation of organohalosilanes, are well known in the art. Methods of preparing organohydrogenpolysiloxane resins suitable for use as ingredient (II') are also well known as exemplified in U.S. Pat. Nos. 5,310,843; 4,370,358; and 4,707,531.

Ingredient (III') Hydrosilylation Catalyst

Ingredient (III') of the hydrosilylation cure package is a hydrosilylation catalyst. Ingredient (III') may be added to the hydrosilylation cure package in an amount ranging from 1 to 1000 ppm of platinum group metal, alternatively 2 to 500 ppm, alternatively 2 to 200, alternatively 5 to 15 ppm, based on the weight of the curable silicone composition.

Suitable hydrosilylation catalysts are known in the art and commercially available. Ingredient (III') may comprise a platinum group metal selected from platinum, rhodium, ruthenium, palladium, osmium or iridium metal or organometallic compound thereof, or a combination thereof. Ingredient (III') is exemplified by compounds such as chloroplatinic acid, chloroplatinic acid hexahydrate, platinum black, platinum dichloride, and complexes of said compounds with low molecular weight organopolysiloxanes or platinum compounds microencapsulated in a matrix or coreshell type structure. Complexes of platinum with olefins or low molecular weight organopolysiloxanes, such as 1,3-diethenyl-1,1,3,3-tetramethyldisiloxane complexes with platinum. These complexes may be microencapsulated in a resin matrix or coreshell type structure. Alternatively, the catalyst may comprise 1,3-diethenyl-1,1,3,3-tetramethyldisiloxane complex with platinum. When the catalyst is a platinum complex with a low molecular weight organopolysiloxane, the amount of catalyst may range from 0.04 to 0.4% based on the weight of the curable silicone composition.

Suitable hydrosilylation catalysts for ingredient (III') are described in, for example, U.S. Pat. Nos. 3,159,601; 3,220,972; 3,296,291; 3,419,593; 3,516,946; 3,814,730; 3,989,668; 4,784,879; 5,036,117; and 5,175,325 and EP 0 347 895 B. Microencapsulated hydrosilylation catalysts and methods of preparing them are known in the art, as exemplified in U.S. Pat. Nos. 4,766,176; and 5,017,654.

The hydrosilylation cure package may be cured at room temperature or with heating. The hydrosilylation cure package may be cured at ambient temperatures for at least 48 hours. Alternatively, the hydrosilylation cure package may be cured by heating at a temperature ranging from 50° C. to 200° C., alternatively 100° C. to 150° C. for a time ranging from 1 minute to 60 minutes, alternatively 30 to 45 minutes.

Radical Cure Packages

Alternatively, the silicone cure package may comprise a radical curable composition. Exemplary radical curable compositions include compositions curable by exposure to UV radiation or heat, or both and alkylborane curable compositions.

Additional Ingredients

The curable silicone composition may further comprise one or more additional ingredients. The curable silicone composition may further comprise an additional ingredient selected from the group consisting of (IV) a filler such as a reinforcing filler, an extending filler, a conductive filler (e.g., electrically conductive, thermally conductive, or both), or a combination thereof; (V) a filler treating agent, (VI) a stabilizer (e.g., a cure modifier such as a hydrosilylation cure modifier when a hydrosilylation cure package is used, a heat stabilizer, a UV stabilizer, or a combination thereof), (VII) a void reducing agent, (VIII) a plasticizer, (IX), a chain extender (sometimes referred to as a secondary plasticizer or processing aid), (X) an adhesion promoter, (XI) a fungicide, (XII) a rheological additive, (XIII) a flame retardant, (XIV) a pigment, and a combination thereof.

Ingredient (IV) Filler

Ingredient (IV) is a filler. The amount of ingredient (IV) added to the curable silicone composition depends on the type of filler selected. However, ingredient (IV) may be added in an amount of 0% to 90%, alternatively 0.1 to 90 weight % based on the weight of the curable silicone composition. Suitable fillers are exemplified by reinforcing fillers and extending fillers, and combinations thereof. Examples of suitable reinforcing fillers include reinforcing silica fillers such as fume silica, silica aerogel, silica zerogel, and precipitated silica. Fumed silicas are known in the art and commercially available, such as fumed silica sold under the name CAB-O-SIL by Cabot Corporation of Massachusetts. Examples of suitable extending fillers include crushed quartz, aluminum oxide, magnesium oxide, calcium carbonate, zinc oxide, talc, diatomaceous earth, iron oxide, clays, titanium dioxide, zirconia, sand, carbon black, graphite, or a combination thereof. Extending fillers are known in the art and commercially available, such as a ground silica sold under the name MIN-U-SIL by U.S. Silica of Berkeley Springs, W.V.

Conductive fillers (i.e., fillers that are thermally conductive, electrically conductive, or both) may also be used as ingredient (IV) in addition to or instead of reinforcing and/or extending fillers. Suitable conductive fillers include metal particles, metal oxide particles, and a combination thereof. Suitable thermally conductive fillers are exemplified by aluminum nitride; aluminum oxide; barium titanate; beryllium oxide; boron nitride; diamond; graphite; magnesium oxide; metal particulate such as copper, gold, nickel, or silver; silicon carbide; tungsten carbide; zinc oxide, and a combination thereof.

Conductive fillers are known in the art and commercially available; see for example, U.S. Pat. No. 6,169,142 (col. 4, lines 7-33). For example, CB-A20S and Al-43-Me are aluminum oxide fillers of differing particle sizes commercially available from Showa-Denko, and AA-04, AA-2, and AA18 are aluminum oxide fillers commercially available from Sumitomo Chemical Company. Silver filler is commercially available from Metalor Technologies U.S.A. Corp. of Attleboro, Mass., U.S.A. Boron nitride filler is commercially available from Advanced Ceramics Corporation, Cleveland, Ohio, U.S.A.

The shape of the filler particles is not specifically restricted, however, rounded or spherical particles may prevent viscosity increase to an undesirable level upon high loading of the filler in the curable silicone composition.

A combination of fillers having differing particle sizes and different particle size distributions may be used. For example, it may be desirable to combine a first filler having a larger average particle size with a second filler having a smaller average particle size in a proportion meeting the closest packing theory distribution curve. This improves packing efficiency and may reduce viscosity and enhance heat transfer.

Ingredient (V) Filler Treating Agent

The filler may optionally be surface treated with a treating agent. Treating agents and treating methods are known in the art; see for example, U.S. Pat. No. 6,169,142 (col. 4, line 42 to col. 5, line 2). The filler may be treated with the treating agent before combining the filler with the other ingredients of the curable silicone composition, or the filler may be treated in situ. Ingredient (V) may comprise an alkoxysilane, an alkoxy-functional oligosiloxane, a cyclic polyorganosiloxane, a hydroxyl-functional oligosiloxane such as a dimethyl siloxane or methyl phenyl siloxane, or a fatty acid. Examples of stearates include calcium stearate. Examples of filler treating agents and methods for their use are disclosed in, for example, EP 1 101 167 A2 and U.S. Pat. Nos. 5,051,455, 5,053,442, and 6,169,142 (col. 4, line 42 to col. 5, line 2).

The treating agent may comprise an alkoxysilane having the formula: $R^{13}_uSi(OR^{14})_{(4-u)}$, where subscript u is 1, 2, or 3; alternatively u is 3. Each $R^{13}$ is independently a monovalent organic group of 1 to 50 carbon atoms, alternatively 8 to 30 carbon atoms. $R^{13}$ is exemplified by alkyl groups such as hexyl, octyl, dodecyl, tetradecyl, hexadecyl, and octadecyl; and aromatic groups such as benzyl, phenyl and phenylethyl. Each $R^{14}$ is independently a monovalent hydrocarbon group of 1 to 4, alternatively 1 to 2 carbon atoms.

The treating agent is exemplified by hexyltrimethoxysilane, octyltriethoxysilane, decyltrimethoxysilane, dodecyltrimethoxysilane, tetradecyltrimethoxysilane, phenyltrimethoxysilane, phenylethyltrimethoxysilane, octadecyltrimethoxysilane, octadecyltriethoxysilane, and a combination thereof.

Alkoxy-functional oligosiloxanes can also be used as treating agents. Alkoxy-functional oligosiloxanes and methods for their preparation are known in the art, see for example, EP 1 101 167 A2. For example, suitable alkoxy-functional oligosiloxanes include those of the formula $(R^{15}O)_vSi(OSiR^{16}_2R^{17})_{(4-v)}$. In this formula, subscript v is 1, 2, or 3, alternatively v is 3. Each $R^{15}$ may independently be an alkyl group. Each $R^{16}$ may be independently selected from monovalent hydrocarbon groups of 1 to 10 carbon atoms. Each $R^{17}$ may independently be a monovalent hydrocarbon group having at least 11 carbon atoms.

Metal fillers can be treated with alkylthiols such as octadecyl mercaptan and others, and fatty acids such as oleic acid, stearic acid, titanates, titanate coupling agents, zirconate coupling agents, and a combination thereof.

Alkoxysilyl functional alkylmethyl polysiloxanes (e.g., partial hydrolysis condensate of $R^{18}_wR^{19}_xSi(OR^{20})_{(4-w-x)}$ or cohydrolysis condensates or mixtures), similar materials where the hydrolyzable group would be silazane, acyloxy or oximo may also be used as treating agents. In all of these, a group tethered to Si, such as $R^{18}$ in the formula above, is a long chain unsaturated monovalent hydrocarbon or monovalent aromatic-functional hydrocarbon. $R^{19}$ is a monovalent hydrocarbon group, and $R^{20}$ is a monovalent hydrocarbon group of 1 to 4 carbon atoms. In the formula above, subscript w is 1, 2, or 3 and subscript x is 0, 1, or 2, with the proviso that the quantity (w+x) is 1, 2, or 3. The amount of ingredient (V) depends on various factors including the type and amount of filler selected. However, ingredient (V) may be added to the curable silicone composition in an amount of 1 to 15 weight % based on the weight of the filler.

Ingredient (VI) Stabilizer

Ingredient (VII) is a stabilizer. The stabilizer may be selected from e.g., a cure modifier such as a hydrosilylation cure modifier when a hydrosilylation cure package is used, a heat stabilizer, a UV stabilizer, or a combination thereof. Stabilizers for hydrosilylation cure packages are exemplified by acetylenic alcohols such as methyl butynol, ethynyl cyclohexanol, dimethyl hexynol, 1,1-dimethyl-2-propynyl)oxy) trimethylsilane, methyl(tris(1,1-dimethyl-2-propynyloxy)) silane, and a combination thereof; cycloalkenylsiloxanes such as methylvinylcyclosiloxanes exemplified by 1,3,5,7-tetramethyl-1,3,5,7-tetravinylcyclotetrasiloxane, 1,3,5,7-tetramethyl-1,3,5,7-tetrahexenylcyclotetrasiloxane, and a combination thereof; ene-yne compounds such as 3-methyl-3-penten-1-yne, 3,5-dimethyl-3-hexen-1-yne; triazoles such as benzotriazole; phosphines; mercaptans; hydrazines; amines such as tetramethyl ethylenediamine, dialkyl fumarates, dialkenyl fumarates, dialkoxyalkyl fumarates, maleates such as diallyl maleate, and a combination thereof. Alternatively, the stabilizer may comprise phenyl butynol. Suitable hydrosilylation cure package stabilizers are disclosed by, for example, U.S. Pat. Nos. 3,445,420; 3,989,667; 4,584,361; and 5,036,117.

The amount of stabilizer added to the curable silicone composition will depend on the particular stabilizer used and the composition and amount of silicone cure package. However, the amount of hydrosilylation cure package stabilizer may range from 0.0025% to 0.025% based on the weight of the hydrosilylation cure package.

One skilled in the art would recognize that the curable silicone composition may comprise more than one silicone cure package. For example a dual cure package that is both moisture curable and hydrosilylation curable is within the scope of this invention. One skilled in the art would be able to select ingredients and amounts thereof in each cure package described above to prepare a cured product that has a desired consistency, such as a rubber or gel.

Chain Extender

The chain extender may be a reactive additive that is added to the curable silicone composition for viscosity control. For example, when a hydrosilylation cure package is used, the chain extender may be a hydrogen terminated polydiorganosiloxane. Furthermore, the chain extender may also be used for control of SiH/vinyl ratio in hydrosilylation curable silicone compositions. The chain extender may also provide the benefit of improving mechanical characteristics of the cured silicone product. The chain extender may be added in addition to, or instead of, the crosslinking agent. For example, a suitable chain extender for a hydrosilylation curable composition comprises a compound of the formula $R^9{}_2HSiO(R^9{}_2SiO)_j(R^9HSiO)_kSiR^9{}_2H$, where subscript k is 0, and $R^9$ and subscript j are as described above.

Method of Making the Curable Silicone Composition

The curable silicone composition may be prepared as a one part composition, for example, by combining all ingredients by any convenient means, such as mixing. Alternatively, the curable silicone composition may be prepared as a multiple part composition in which the crosslinking agent and catalyst are stored in separate parts, and the parts are combined shortly before use of the curable silicone composition. For example, a two part curable silicone composition may be prepared by combining ingredients comprising base polymer and catalyst, and one or more additional ingredients in a first part by any convenient means such as mixing. A second part may be prepared by combining ingredients comprising base polymer and crosslinking agent, and one or more additional ingredients by any convenient means such as mixing. The ingredients may be combined at ambient or elevated temperature and under ambient or anhydrous conditions, depending on the silicone cure package selected. The curable silicone composition may cure to form an elastomer. The elastomer may have a durometer measured by Shore A of 20 to 70. The polar additive may be in one or more parts of the curable silicone composition, depending on the reactive groups on the polar additive.

Method for Using the Composition

The curable silicone composition described above may be used in a method comprising:

(I) fabricating a cured silicone product by a process comprising curing a curable silicone composition comprising:
  (A) the silicone cure package comprising ingredients, described above; and
  (B) the polar additive comprising a polyalkylene oxide functionality and a reactive functionality, where the reactive functionality is reactive with at least one ingredient of the silicone cure package, and
(II) using the cured silicone product in a pattern transfer technique.

Step (I) may be performed by various means, depending on the silicone cure package selected. For example, the curable silicone composition may be exposure to ambient moisture, when a moisture curable composition is used. Alternatively, the curable silicone composition may be cured a method comprising heating when a hydrosilylation curable composition is used. Alternatively, when a radical curable composition is used, the composition can be cured by a method comprising exposure to radiation, heat, or both. The curable silicone composition may optionally be coated on a substrate, such as plastic, before step (II).

In the method described herein, the pattern transfer technique may be selected from the group consisting of imprint molding, step and flash imprint molding, solvent assisted micromolding, microtransfer molding, micromolding in capillaries, microcontact printing, and roll printing. For example, the cured silicone product described herein may be useful in the method disclosed in U.S. Patent Publication No. 2006/0254440.

For example, a pattern transfer method comprises:

(i) filling a mold with a transfer medium;
(ii) contacting a cured silicone product with the transfer medium such that the transfer medium is transferred onto the cured silicone product, and
(iii) contacting the cured silicone product with a substrate, thereby transferring the transfer medium to the substrate. The cured silicone product may have a flat (nonpatterned) surface.

The cured silicone product used in this method may be a reaction product of a curable silicone composition described above. For example, a curable silicone composition useful in this method comprises:

optionally (I) a polyorganosiloxane having an average of at least two unsaturated organic groups per molecule,
optionally (II) an organohydrogenpolysiloxane, with the proviso that at least one of ingredient (I) and ingredient (II) is present,
(III) a hydrosilylation reaction catalyst, and
(IV) a polar additive comprising a polyalkylene oxide functionality and a reactive functionality selected from an unsaturated organic group and a silicon bonded hydrogen atom, with the proviso that when ingredient (I) is not present, the reactive functionality of ingredient (IV) includes the unsaturated organic group and when ingredient (II) is not present, then the reactive functionality of ingredient (IV) includes a silicon bonded hydrogen atom.

The method may optionally further comprise (iv) repeating step (iii) one or more times after repeating step (ii). Without wishing to be bound by theory, it is thought that the cured silicone product may be used repeatedly in the pattern transfer technique, and that the cured silicone product described herein may provide the benefit of increased cycles; i.e., steps (ii) and (iii) may be repeated more times than with a conventional silicone mold. However, the transfer medium is not limited to conductives and may be selected from the group consisting of conductive media such as conductive inks and conductive pastes, non-conductive media, etch resist layers, over coating/photo-spacer layers (optical layers), and color filter.

Alternatively, the cured silicone product may be used in a soft lithography method. For example, a method comprises:

i) casting a curable silicone composition against a master having patterned features,
ii) curing the curable silicone composition to form a silicone mold, and
iii) removing the silicone mold from the master.

The method may optionally further comprise:

iv) contacting the silicone mold with a transfer medium, and
v) forming the transfer medium into a patterned feature on a surface of a substrate.

Step i) is performed using a curable silicone composition as described above. For example, the curable silicone composition used in this method may comprise:

optionally (I) a polyorganosiloxane having an average of at least two unsaturated organic groups per molecule,
optionally (II) an organohydrogenpolysiloxane, with the proviso that at least one of ingredient (I) and ingredient (II) is present,
(III) a hydrosilylation reaction catalyst, and
(IV) a polar additive comprising a polyalkylene oxide functionality and a reactive functionality selected from an unsaturated organic group and a silicon bonded hydrogen atom, with the proviso that when ingredient (I) is not present, the reactive functionality of ingredient (IV) includes the unsaturated organic group and when ingredient (II) is not present, then the reactive functionality of ingredient (IV) includes a silicon bonded hydrogen atom.

This method may optionally further comprise vi) repeating step v) one or more times after repeating step iv). Without wishing to be bound by theory, it is thought that the silicone mold may be used repeatedly in the patterning technique.

The methods described above may be used to make a pattern on various substrates. For example the substrate may be a component of a flat panel display, liquid crystal display, solar cell, printed circuit board, plasma display panel, or RFID. The methods described above may be useful for use in color matrix fabrication, electrode deposition, plasma display panel fabrication, electromagnetic interference shielding, and resist patterning.

EXAMPLES

These examples are included to demonstrate the invention, and those of ordinary skill in the art should appreciate that, in light of the present disclosure, many changes can be made in the specific embodiments which are disclosed and still obtain a like or similar result without departing from the spirit and scope of the invention. All amounts, ratios, and percentages are by weight unless otherwise indicated. The following components were used in these examples.

Base Polymer A was a mixture of 68% dimethylvinylsiloxy-terminated, polydimethylsiloxane; 31% dimethylvinylated and trimethylated silica, and 1% tetra(trimethylsiloxy) silane.

Base Polymer B was a mixture of 67% dimethylvinylsiloxy-terminated, polydimethylsiloxane, 31% dimethylvinylated and trimethylated silica, 1% tetra(trimethylsiloxy)silane, and 1% impurities.

Base Polymer C was dimethylvinylsiloxy-terminated polydimethylsiloxane.

Base Polymer D was dimethylvinylsiloxy-terminated polydimethylsiloxane.

Base Polymer E was a mixture of 71% dimethylvinylsiloxy-terminated polydimethylsiloxane, 27% dimethylvinylated and trimethylated silica, and 1% impurities.

Base Polymer F was dimethylvinylsiloxy-terminated polydimethylsiloxane.

Crosslinker A was trimethylsiloxy-terminated, poly(dimethyl/methylhydrogen siloxane) copolymer.

Crosslinker B was a hydrogen terminated polydimethylsiloxane.

Chain Extender A was a mixture of 92% hydrogen terminated polydimethylsiloxane, 5% octamethylcyclotetrasiloxane, and 2% decamethylcylopentasiloxane. In these examples, Chain Extender A was added for control of SiH/Vi ratio and viscosity control to 4000 to 8000 cP for the curable silicone compositions.

Chain Extender B is tetramethyltetravinylcyclotetrasiloxane.

Catalyst A was a mixture of 1.5% of a complex of platinum with 1,3-diethenyl-1,1,3,3-tetramethyldisiloxane, 6% tetramethyldivinyldisiloxane, and 92% dimethylvinylsiloxy-terminated, polydimethylsiloxane.

Polar additive A was a mixture of 1 weight part dimethyl, methyl(propylglycidoxy), methyl(propyl(poly(PO))methyl) cyclosiloxanes and 9 weight parts dimethyl, methyl(glycidoxypropyl), methyl(propyl(poly(PO))methyl) siloxane. Polar additive A is a hydrosilylation product of polypropylene oxide monoallyl methyl ether, allylglycidyl ether, and trimethysiloxy-terminated polydimethyl-co-methylhydrogensiloxane.

Inhibitor A was a mixture of 0.5% phenyl butynol in dimethylvinylsiloxy-terminated polydimethylsiloxane.

BCA was butyl carbitol acetate with CAS# 124-17-4.

PGMEA was propylene glycol methyl ether acetate.

Example 1

A polar additive, namely XUS 13461 ethylene-oxide-propylene oxide (EO-PO) from the Dow Chemical Company of Midland Mich. U.S.A., was added to a DOW CORNING® SYLGARD® 184 formulation from Dow Corning Corporation of Midland Mich. U.S.A. The amount of EO-PO varied from 1 to 20 weight percent. In these samples, it was found that when the amount of EO-PO exceeds 20 wt % in SYLGARD® 184, the resulting mold may become too tacky to be used in some soft lithographic processes.

After mixing with EO-PO, the resulting compositions were significantly more viscous than the SYLGARD® 184 formulation without EO-PO. A hot press cure method was used to fabricate a mold with micro-scale features. The press cure method forced the viscous composition into the master mold to produce a high fidelity pattern in the polar mold. After curing, a negative image of the patterned features from the master mold was replicated in the modified PDMS mold surface, as shown in FIG. 1.

Figure 2:
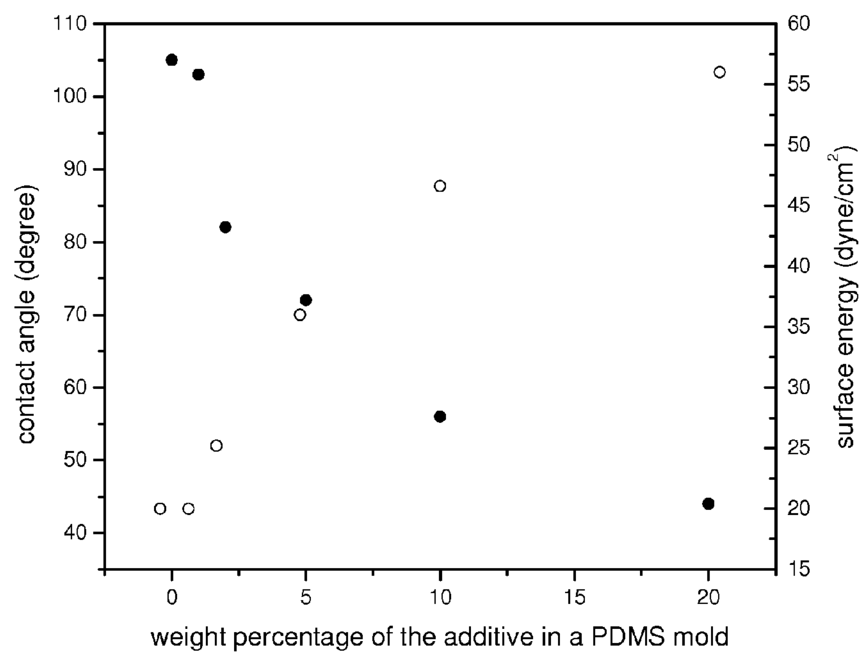
FIG. 2 shows changes in the water contact angle and surface energy with increasing levels of EO-PO in the mold (•contact angle, ○ surface energy) of FIG. 1.

After the modified PDMS molds were fabricated, surface energy measurements were performed. FIG. 2 shows the values of the surface energy and water contact angles as a function of EO-PO amounts. There is a significant increase in the mold polarity after EO-PO addition. Similarly a dramatic decrease in water contact angle was observed.

Figure 3:
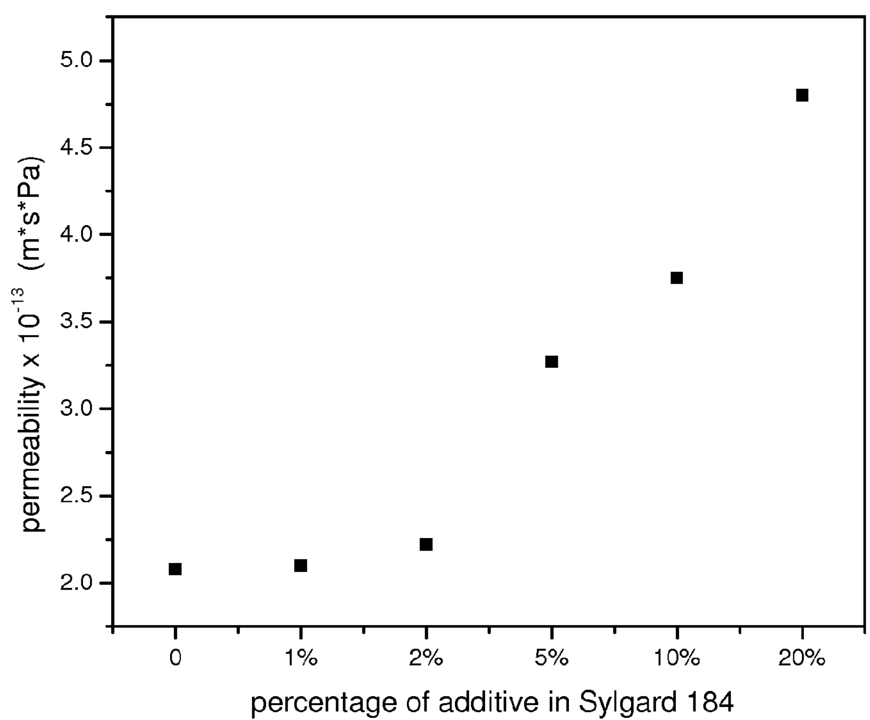
FIG. 3 shows permeability of ethanol through the modified SYLGARD® 184 mold membrane as a function of the amount of EO-PO.
Figure 4:
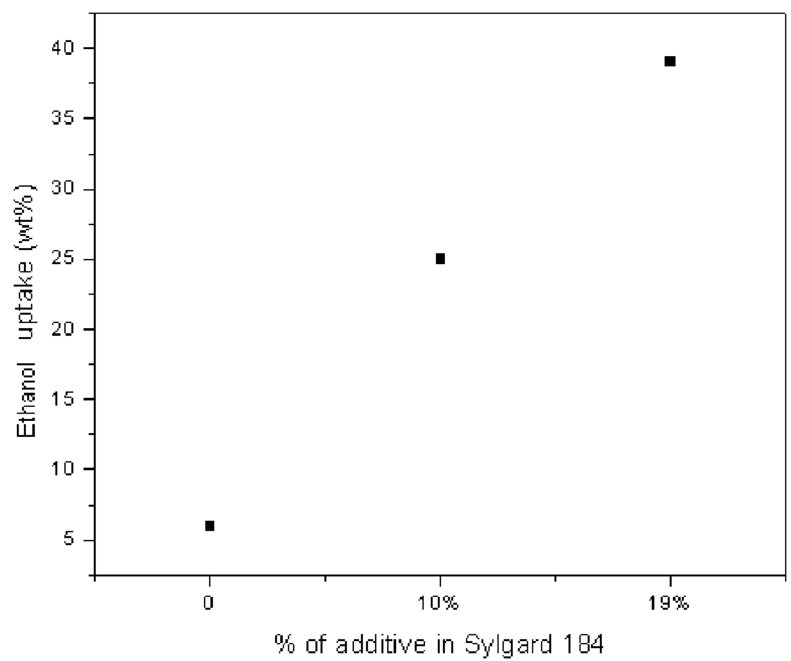
FIG. 4 shows ethanol saturation weight gain as a function of the amount of EO-PO additive in SYLGARD® 184 molds prepared in example 1.

As a result of the EO-PO, the polar solvent permeability is increased, as well as the polar solvent adsorption. FIG. 3 shows the permeability of ethanol into the modified PDMS molds. FIG. 4 shows the ethanol up-take of the modified silicone molds after they were soaked in ethanol.

Comparative Example 2

Two Part Sample without Polar Additive

A two part sample was prepared by mixing the components in the amounts shown in Table 1 to form parts A and B. Parts A and B were mixed in a 1:1 ratio. Molar SiH/Vi ratio of the Mixture was 1.5. Resin/Polymer ratio of the Mixture was 0.45. The amount of Resin in the Mixture was 29%.

TABLE 1

| | Part A | Part B | Mixture of A & B |
|---|---|---|---|
| Base Polymer A | 99.83 | 3.87 | 103.70 |
| Crosslinker A | | 6.00 | 6.00 |
| Catalyst A | 0.17 | | 0.17 |
| Chain Extender B | | 0.13 | 0.13 |

Example 3

A two part sample was prepared by mixing the components in the amounts shown in Table 2 to form parts A and B. Parts A and B were mixed in a 1:1 ratio. Molar SiH/Vi ratio of the Mixture was 1.6. Resin/Polymer ratio of the Mixture was 0.45. The amount of Resin in the Mixture was 28%.

TABLE 2

| | Part A | Part B | Mixture of A & B |
|---|---|---|---|
| Base Polymer A | 94.92 | 3.87 | 98.79 |
| Crosslinker A | | 6.00 | 6.00 |
| Catalyst A | 0.16 | | 0.16 |
| Chain Extender B | | 0.13 | 0.13 |
| Polar Additive A | 4.92 | | 4.92 |

Comparative Example 4

A two part sample was prepared by mixing the components in the amounts shown in Table 3 to form parts A and B. Parts A and B were mixed in a 1:1 ratio. Molar SiH/Vi ratio of the Mixture was 1.6. Resin/Polymer ratio of the Mixture was 0.28. The amount of Resin in the Mixture was 19%.

TABLE 3

| | Part A | Part B | Mixture of A & B |
|---|---|---|---|
| Base Polymer F | 13.24 | 8.24 | 21.48 |
| Base Polymer E | 86.40 | | 86.40 |
| Crosslinker B | | 7.92 | 7.92 |
| Crosslinker A | | 3.60 | 3.60 |
| Chain Extender B | | 0.24 | 0.24 |
| Catalyst A | 0.36 | | 0.36 |

Comparative Example 5

A two part sample was prepared by mixing the components in the amounts shown in Table 4 to form parts A and B. Parts A and B were mixed in a 1:1 ratio. Molar SiH/Vi ratio of the Mixture was 1.4. Resin/Polymer ratio of the Mixture was 0.45. The amount of Resin in the Mixture was 27%.

TABLE 4

| | Part A | Part B | Mixture of A & B |
|---|---|---|---|
| Base Polymer B | 99.68 | 72.20 | 171.88 |
| Crosslinker A | | 5.40 | 5.40 |
| Crosslinker B | | 22.00 | 22.00 |
| Chain Extender B | | 0.40 | 0.40 |
| Catalyst A | 0.32 | | 0.32 |

Example 6

A two part sample was prepared by mixing the components in the amounts shown in Table 5 to form parts A and B. Parts A and B were mixed in a 1:1 ratio. Molar SiH/Vi ratio of the Mixture was 2.5. Resin/Polymer ratio of the Mixture was 0.17. The amount of Resin in the Mixture was 11%.

TABLE 5

| | Part A | Part B | Mixture of A & B |
|---|---|---|---|
| Base Polymer B | 43.36 | | 43.36 |
| Base Polymer C | 28.53 | | 28.53 |
| Base Polymer D | 22.40 | | 22.40 |
| Crosslinker A | | 3.60 | 3.60 |
| Chain Extender A | | 8.40 | 8.40 |
| Inhibitor A | | 8.00 | 8.00 |
| Polar Additive A | 4.91 | | 4.91 |
| Catalyst A | 0.80 | | 0.80 |

Example 7

A two part sample was prepared by mixing the components in the amounts shown in Table 6 to form parts A and B. Parts A and B were mixed in a 1:1 ratio. Molar SiH/Vi ratio of the Mixture was 2.4. Resin/Polymer ratio of the Mixture was 0.17. The amount of Resin in the Mixture was 12%.

TABLE 6

| | Part A | Part B | Mixture of A & B |
|---|---|---|---|
| Base Polymer B | 45.60 | | 45.60 |
| Base Polymer C | 30.00 | | 30.00 |
| Base Polymer D | 23.56 | 0.00 | 23.56 |
| Crosslinker A | | 3.60 | 3.60 |
| Chain Extender A | | 8.40 | 8.40 |
| Inhibitor A | | 8.00 | 8.00 |
| Polar Additive A | 1.00 | | 1.00 |
| Catalyst A | 0.84 | | 0.84 |

Example 8

A two part sample was prepared by mixing the components in the amounts shown in Table 7 to form parts A and B. Parts A and B were mixed in a 1:1 ratio. Molar SiH/Vi ratio of the Mixture was 2.4. Resin/Polymer ratio of the Mixture was 0.17. The amount of Resin in the Mixture was 11%.

TABLE 7

| | Part A | Part B | Mixture of A & B |
|---|---|---|---|
| Base Polymer B | 45.60 | | 45.60 |
| Base Polymer C | 30.00 | | 30.00 |
| Base Polymer D | 23.56 | | 23.56 |
| Crosslinker A | | 3.60 | 3.60 |
| Chain Extender A | | 8.40 | 8.40 |
| Inhibitor A | | 8.00 | 8.00 |
| Polar Additive A | 3.00 | | 3.00 |
| Catalyst A | 0.84 | | 0.84 |

Example 9

A two part sample was prepared by mixing the components in the amounts shown in Table 8 to form parts A and B. Parts A and B were mixed in a 1:1 ratio. Molar SiH/Vi ratio of the Mixture was 2.4. Resin/Polymer ratio of the Mixture was 0.17. The amount of Resin in the Mixture was 11%.

TABLE 8

| | Part A | Part B | Mixture of A & B |
|---|---|---|---|
| Base Polymer B | 45.60 | | 45.60 |
| Base Polymer C | 30.00 | | 30.00 |
| Base Polymer D | 23.56 | 0.00 | 23.56 |
| Crosslinker A | | 3.60 | 3.60 |
| Chain Extender A | | 8.40 | 8.40 |
| Inhibitor A | | 8.00 | 8.00 |
| Polar Additive A | 7.00 | | 7.00 |
| Catalyst A | 0.84 | | 0.84 |

Example 10

A two part sample was prepared by mixing the components in the amounts shown in Table 9 to form parts A and B. Parts A and B were mixed in a 1:1 ratio. Molar SiH/Vi ratio of the Mixture was 2.4. Resin/Polymer ratio of the Mixture was 0.17. The amount of Resin in the Mixture was 11%.

TABLE 9

| | Part A | Part B | Mixture of A & B |
|---|---|---|---|
| Base Polymer B | 45.60 | | 45.60 |
| Base Polymer C | 30.00 | | 30.00 |
| Base Polymer D | 23.56 | 0.00 | 23.56 |
| Crosslinker A | | 3.60 | 3.60 |
| Chain Extender A | | 8.40 | 8.40 |
| Inhibitor A | | 8.00 | 8.00 |
| Polar Additive A | 10.00 | | 10.00 |
| Catalyst A | 0.84 | | 0.84 |

Example 11

A two part sample was prepared by mixing the components in the amounts shown in Table 10 to form parts A and B. Parts A and B were mixed in a 1:1 ratio. Molar SiH/Vi ratio of the Mixture was 2.4. Resin/Polymer ratio of the Mixture was 0.17. The amount of Resin in the Mixture was 9%.

TABLE 10

| | Part A | Part B | Mixture of A & B |
|---|---|---|---|
| Base Polymer B | 45.60 | | 45.60 |
| Base Polymer C | 30.00 | | 30.00 |
| Base Polymer D | 23.56 | 0.00 | 23.56 |
| Crosslinker A | | 3.60 | 3.60 |
| Chain Extender A | | 8.40 | 8.40 |
| Inhibitor A | | 8.00 | 8.00 |
| Polar Additive A | 40.00 | | 40.00 |
| Catalyst A | 0.84 | | 0.84 |

Example 12

A two part sample was prepared by mixing the components in the amounts shown in Table 11 to form parts A and B. Parts A and B were mixed in a 1:1 ratio. Molar SiH/Vi ratio of the Mixture was 2.4. Resin/Polymer ratio of the Mixture was 0.17. The amount of Resin in the Mixture was 8%.

TABLE 11

| | Part A | Part B | Mixture of A & B |
|---|---|---|---|
| Base Polymer B | 45.60 | | 45.60 |
| Base Polymer C | 30.00 | | 30.00 |
| Base Polymer D | 23.56 | | 23.56 |
| Crosslinker A | | 3.60 | 3.60 |
| Chain Extender A | | 8.40 | 8.40 |
| Inhibitor A | | 8.00 | 8.00 |
| Polar Additive A | 60.00 | | 60.00 |
| Catalyst A | 0.84 | | 0.84 |

Example 13

A two part sample was prepared by mixing the components in the amounts shown in Table 12 to form parts A and B. Parts A and B were mixed in a 1:1 ratio. Molar SiH/Vi ratio of the Mixture was 2.4. Resin/Polymer ratio of the Mixture was 0.17. The amount of Resin in the Mixture was 7%.

TABLE 12

| | Part A | Part B | Mixture of A & B |
|---|---|---|---|
| Base Polymer B | 45.60 | | 45.60 |
| Base Polymer C | 30.00 | | 30.00 |
| Base Polymer D | 23.56 | | 23.56 |
| Crosslinker A | | 3.60 | 3.60 |
| Chain Extender A | | 8.40 | 8.40 |
| Inhibitor A | | 8.00 | 8.00 |
| Polar Additive A | 80.00 | | 80.00 |
| Catalyst A | 0.84 | | 0.84 |

Example 14

A two part sample was prepared by mixing the components in the amounts shown in Table 13 to form parts A and B. Parts A and B were mixed in a 1:1 ratio. Molar SiH/Vi ratio of the Mixture was 2.4. Resin/Polymer ratio of the Mixture was 0.17. The amount of Resin in the Mixture was 6%.

TABLE 13

| | Part A | Part B | Mixture of A & B |
|---|---|---|---|
| Base Polymer B | 45.60 | | 45.60 |
| Base Polymer C | 30.00 | | 30.00 |
| Base Polymer D | 23.56 | 0.00 | 23.56 |
| Crosslinker A | | 3.60 | 3.60 |
| Chain Extender A | | 8.40 | 8.40 |
| Inhibitor A | | 8.00 | 8.00 |
| Polar Additive A | 100.00 | | 100.00 |
| Catalyst A | 0.84 | | 0.84 |

Figure 5:
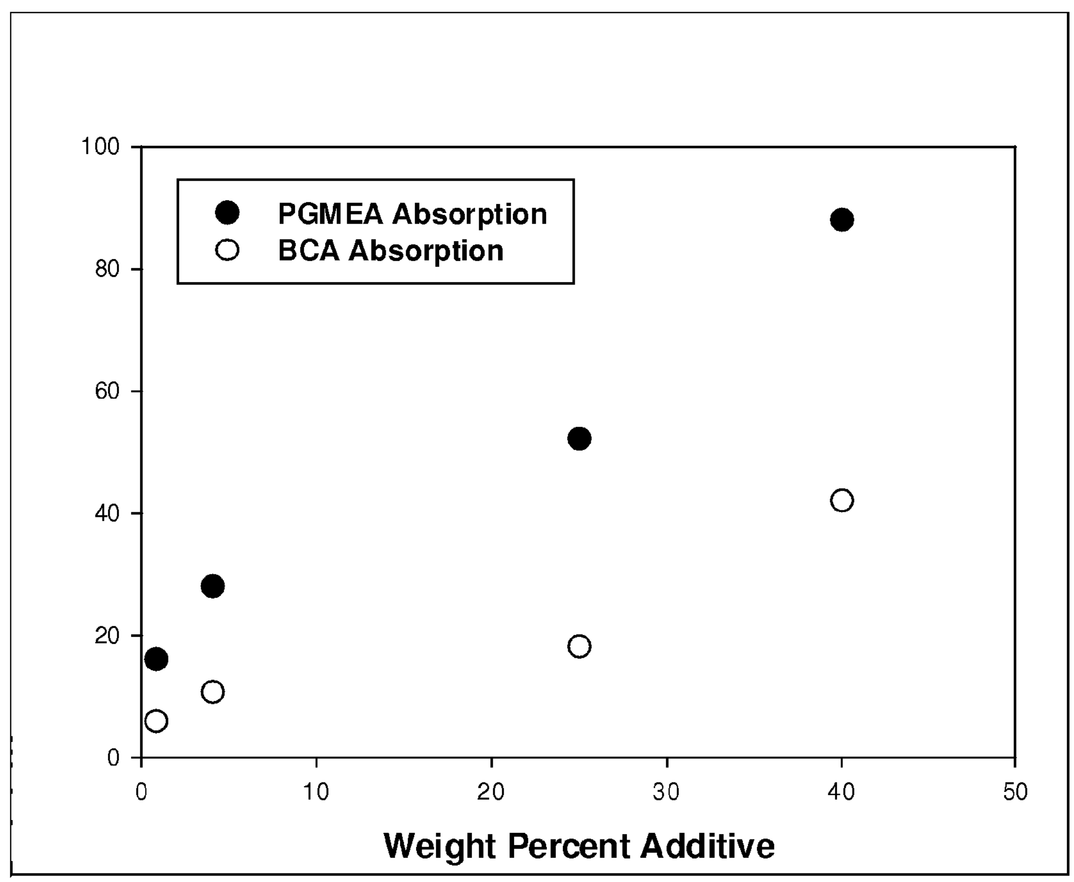
FIG. 5 shows solvent uptake as a function of the amount of EO-PO additive of the SYLGARD® 184 molds prepared in examples 6, 7, 13, and 14.

Samples 6, 7, 11, and 13 were exposed to solvent for 5 minutes. Solvent uptake (%) was measured, and the results are in Table 14 and FIG. 5.

TABLE 14

Solvent Uptake Results

| Example | % Polar Additive | % PGMEA Uptake | % BCA Uptake |
|---|---|---|---|
| 7 | 0.83 | 17 | 6 |
| 6 | 4 | 28 | 11 |
| 11 | 25 | 52 | 18 |
| 13 | 40 | 88 | 42 |

These results show that the solvent uptake increases as the amount of polar additive increases in the formulations for these examples. Uptake increases with both PGMEA and BCA solvents. However, in these formulations, if the amount of Polar Additive A is too high, this may cause viscosity of the curable silicone composition to increase to an undesirable level or the film surface to become bumpy rather than smooth, or both. Therefore, in these formulations, up to 50% of Polar Additive A may be added, alternatively, up to 20% of Polar Additive A.

Industrial Applicability

Without wishing to be bound by theory, it is thought that the polar additive described herein may provide the benefits of allowing uptake of polar substances from the transfer medium, such as a conductive ink, to the cured silicone product and improve wetting of the cured silicone product, and thereby improve quality of patterns prepared by using conventional polar inks with the cured silicone product. Without wishing to be bound by theory, it is thought that the cured silicone product of this invention has improved durability of cycle lifetime and/or durability of hydrophilicity, i.e., the hydrophilicity lasts longer than hydrophilicity of conventional silicone molds that are surface treated either with oxygen plasma treatment or with a polyethylene glycol reacted onto the surface. Furthermore, the polyalkylene oxide additives described herein, such as allyloxy terminated poly(ethylene oxide/propylene oxide) copolymers are commercially available, low cost intermediates. Without wishing to be bound by theory, it is thought that these copolymers may provide the further benefits of acting as either a base polymer, or an inhibitor to hydrosilylation curable compositions, or both; and that this may minimize the need to add a separate base polymer, a separate stabilizer, or both when a hydrosilylation cure package is used.

The invention claimed is:

1. A method for soft lithography comprising:

(i) filling a mold with a transfer medium;

(ii) contacting a cured silicone product with the transfer medium such that the transfer medium is transferred onto the cured silicone product, where the cured silicone product is a reaction product of a curable silicone composition comprising a combination of a linear polyorganosiloxane having an average of at least two unsaturated organic groups per molecule and a resin polyorganosiloxane consisting of $R^8_3SiO_{1/2}$ units and $SiO_{4/2}$ units, or a combination of a linear polyorganosiloxane having an average of at least two unsaturated organic groups per molecule and a resin polyorganosiloxane consisting of $R^8SiO_{3/2}$ units and $R^8_2SiO_{2/2}$ units, or a combination of a linear polyorganosiloxane having an average of at least two unsaturated organic groups per molecule and a resin polyorganosiloxane consisting of $R^8_3SiO_{1/2}$ units and $R^8SiO_{3/2}$ units, or a combination of a linear polyorganosiloxane having an average of at least two unsaturated organic groups per molecule and a resin polyorganosiloxane consisting of $R^8_3SiO_{1/2}$ units, $R^8SiO_{3/2}$ units, and $R^8_2SiO_{2/2}$ units, or mixtures thereof, where each $R^8$ is a monovalent organic group, an organohydrogenpolysiloxane, a hydrosilylation reaction catalyst, and a polar additive comprising a polyalkylene oxide functionality and a reactive functionality selected from an unsaturated organic group or a silicon bonded hydrogen atom; and (iii) contacting the cured silicone product with a substrate, thereby transferring the transfer medium to the substrate.

2. The method of claim 1, further comprising:

(iv) repeating step (iii) one or more times after repeating step (ii).

3. A method for soft lithography comprising:

i) casting a curable silicone composition against a master having patterned features, where the curable silicone composition comprises a combination of a linear polyorganosiloxane having an average of at least two unsaturated organic groups per molecule and a resin polyorganosiloxane consisting of $R^8_3SiO_{1/2}$ units and $SiO_{4/2}$ units, or a combination of a linear polyorganosiloxane having an average of at least two unsaturated organic groups per molecule and a resin polyorganosiloxane consisting of $R^8SiO_{3/2}$ units and $R^8_2SiO_{2/2}$ units, or a combination of a linear polyorganosiloxane having an average of at least two unsaturated organic groups per molecule and a resin polyorganosiloxane consisting of $R^8_3SiO_{1/2}$ units and $R^8SiO_{3/2}$ units, or a combination of a linear polyorganosiloxane having an average of at least two unsaturated organic groups per molecule and a resin polyorganosiloxane consisting of $R^8_3SiO_{1/2}$ units, $R^8SiO_{3/2}$ units, and $R^8_2SiO_{2/2}$ units, or mixtures thereof, where each $R^8$ is a monovalent organic group, an organohydrogenpolysiloxane, a hydrosilylation reaction catalyst, and a polar additive comprising a polyalkylene oxide functionality and a reactive functionality selected from an unsaturated organic group and a silicon bonded hydrogen atom;

ii) curing the curable silicone composition to form a silicone mold, and iii) removing the silicone mold from the master;

iv) contacting the silicone mold with a transfer medium selected from a conductive ink and a conductive paste; and v) forming the transfer medium into a patterned feature on a surface of a substrate.

4. The method of claim 3, further comprising:

vi) repeating step v) one or more times after repeating step iv).

5. The method of claim 1, where the transfer medium is a conductive ink or conductive paste.

6. The method of claim 1, where the substrate is a component of a flat panel display, solar cell, printed circuit board, plasma display panel, or RFID.

7. A method for soft lithography comprising:

(I) fabricating a cured silicone product by a process comprising curing a curable silicone composition comprising:

(A) a silicone cure package that comprises at least two of a base polymer, a crosslinking agent, and a catalyst, wherein the base polymer is a combination of a linear polyorganosiloxane having an average of at least two unsaturated organic groups per molecule and a resin polyorganosiloxane consisting of $R^8_3SiO_{1/2}$ units and $SiO_{4/2}$ units, or a combination of a linear polyorganosiloxane having an average of at least two unsaturated organic groups per molecule and a resin polyorganosiloxane consisting of $R^8SiO_{3/2}$ units and $R^8_2SiO_{2/2}$ units, or a combination of a linear polyorganosiloxane having an average of at least two unsaturated organic groups per molecule and a resin polyorganosiloxane consisting of $R^8_3SiO_{1/2}$ units and $R^8SiO_{3/2}$ units, or a combination of a linear polyorganosiloxane having an average of at least two unsaturated organic groups per molecule and a resin polyorganosiloxane consisting of $R^8_3SiO_{1/2}$ units, $R^8SiO_{3/2}$ units, and $R^8_2SiO_{2/2}$ units, or mixtures thereof, where each $R^8$ is a monovalent organic group; and (B) a polar additive comprising a polyalkylene oxide functionality and a reactive functionality, and (II) using the cured silicone product in a pattern transfer technique selected from elected from the group consisting of imprint molding, step and flash imprint molding, solvent assisted micromolding, microtransfer molding, micromolding in capillaries, microcontact printing, and roll printing.

8. The method of claim 7, where the silicone cure package is selected from the group consisting of hydrosilylation curable composition, a condensation curable composition, a radical curable composition, a ring opening polymerizable composition, an addition curable composition, and a combination thereof.

9. The method of claim 1, where the polar additive is a poly(ethylene oxide/ propylene oxide) copolymer.

10. The method of claim 1, where the polar additive is a polyalkylene oxide-functional siloxane.

11. The method of claim 1, where the polar additive is a polyalkylene oxide having reactive end groups.

12. The method of claim 1, where the polar additive is selected from the group consisting of methyl(propylglycidoxy), methyl(propyl(poly(propylene oxide))methyl) cyclosiloxanes; methyl(glycidoxypropyl), methyl(propyl (poly(propylene oxide))methyl) siloxane; and combinations thereof.

13. The method of claim 1, where the polar additive has the general formula:

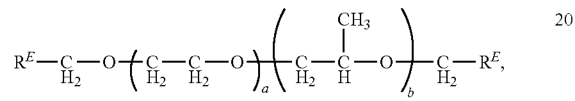

where each $R^E$ is independently a reactive endgroup, subscript a has a value ranging from 1 to 20, and subscript b has a value ranging from 0 to 20.

* * * * *